US009581656B2

(12) United States Patent
Halt et al.

(10) Patent No.: US 9,581,656 B2
(45) Date of Patent: Feb. 28, 2017

(54) INVERTER AND METHOD FOR DETECTING A PHASE FAILURE IN AN ENERGY SUPPLY GRID

(71) Applicant: SMA Solar Technology AG, Niestetal (DE)

(72) Inventors: Christian Halt, Melsungen (DE); Christian Hardt, Kassel (DE); Christoph Jordaan, Kassel (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 60 days.

(21) Appl. No.: 14/576,385

(22) Filed: Dec. 19, 2014

(65) Prior Publication Data

US 2015/0177335 A1 Jun. 25, 2015

(30) Foreign Application Priority Data

Dec. 20, 2013 (DE) ........................ 10 2013 114 729

(51) Int. Cl.

| | |
|---|---|
| ***G01R 31/40*** | (2014.01) |
| ***H02M 7/44*** | (2006.01) |
| ***H02M 1/32*** | (2007.01) |
| ***H02M 7/539*** | (2006.01) |
| ***H02S 50/10*** | (2014.01) |

(Continued)

(52) U.S. Cl.

CPC .............. *G01R 31/40* (2013.01); *H02M 1/32* (2013.01); *H02M 7/44* (2013.01); *H02M 7/539* (2013.01); *H02S 50/10* (2014.12); *G01R 31/025* (2013.01); *H02J 3/383* (2013.01); *Y02E 10/563* (2013.01)

(58) Field of Classification Search

CPC ....... G01R 31/40; G01R 31/025; H02M 7/44; H02M 7/539; H02M 1/32; H02J 3/383; H02S 50/10; Y02E 10/563

See application file for complete search history.

(56) References Cited

U.S. PATENT DOCUMENTS

| | | | | |
|---|---|---|---|---|
| 4,600,961 A | 7/1986 | Bishop | | |
| 6,525,543 B1 * | 2/2003 | Roberts | .................. | H02H 3/343 324/522 |

(Continued)

FOREIGN PATENT DOCUMENTS

| | | |
|---|---|---|
| DE | 102006054870 A1 | 6/2008 |
| EP | 2541263 A1 | 1/2013 |

*Primary Examiner* — Fred E Finch, III
*Assistant Examiner* — Demetries A Gibson
(74) *Attorney, Agent, or Firm* — Eschweiler & Associates, LLC

(57) ABSTRACT

An inverter and a method for detecting a phase failure in an energy supply grid during operation of an inverter, which is connected to the energy supply grid for feeding electrical energy via a YNd transformer is disclosed. The method includes transforming the values of the output currents into a symmetrical positive-sequence current value and into a symmetrical negative-sequence current value of a coordinate system rotating at a fundamental frequency of the energy supply grid. The method further includes determining a ratio of the negative-sequence current value to the positive-sequence current value, and signalling a phase failure in the energy supply grid if the determined ratio is greater than a preset threshold value for longer than a preset time period. The disclosure furthermore relates to an inverter designed for implementing the method.

12 Claims, 5 Drawing Sheets

(51) Int. Cl.
*H02J 3/38* (2006.01)
*G01R 31/02* (2006.01)

(56) References Cited

U.S. PATENT DOCUMENTS

| | | | | |
|---|---|---|---|---|
| 2012/0081934 | A1* | 4/2012 | Garrity | H02M 7/46 363/37 |
| 2012/0187924 | A1* | 7/2012 | Dommaschk | H02J 3/1842 323/205 |
| 2013/0051103 | A1* | 2/2013 | Roscoe | H02M 7/53871 363/131 |
| 2013/0155735 | A1* | 6/2013 | Ilic | H02M 7/72 363/71 |
| 2013/0241201 | A1* | 9/2013 | Fortmann | H02J 3/26 290/44 |
| 2013/0321959 | A1* | 12/2013 | Ranstad | H02H 7/1216 361/18 |
| 2015/0103573 | A1* | 4/2015 | Zhu | H02M 1/36 363/131 |

* cited by examiner 7
6
5
4
42
41
1
32
3
31
2
+
~
=

35
357
356
356'
360
344'
344
359
355
355'
Regulation Unit
Regulation Unit
358
354
354'
353
352
352'
351
350
344
344'
iabc

INVERTER AND METHOD FOR DETECTING A PHASE FAILURE IN AN ENERGY SUPPLY GRID

CROSS REFERENCE TO RELATED APPLICATION

This application claims priority to German Patent Application number 102013114729.1, filed on Dec. 20, 2013 and is hereby incorporated by references.

FIELD

The disclosure relates to a method for detecting a phase failure in an energy supply grid during operation of an inverter, which is connected to the energy supply grid for feeding electrical energy via a YNd transformer. The disclosure furthermore relates to an inverter suitable for implementing the method.

BACKGROUND

Inverters are used for converting direct current into a grid-compliant alternating current suitable for feeding into an energy supply grid. Such inverters are used, for example, in photovoltaic systems. If galvanic isolation between the energy supply grid and the inverter is desired or even required on the basis of regulations and legal requirements for specific energy supply grids, the transformer mentioned at the outset is arranged between an AC output of the inverter and the energy supply grid. In particular in the case of relatively large photovoltaic systems which are connected directly to a medium-voltage grid, the use of transformers is imperative. In this case, it is generally additionally required that the medium-voltage grid needs to be grounded effectively. Such required effective grounding can be implemented in a technically suitable manner and inexpensively by virtue of the use of a so-called YNd transformer. In this nomenclature, the abbreviation "YN" describes a high-voltage side in star circuit configuration with a grounded neutral point and "d" describes a low-voltage side in a delta circuit configuration. In some cases, the use of such a YNd transformer is also explicitly specified by operators of the energy supply grid.

A further requirement placed on photovoltaic systems is that fault states of the energy supply grid need to be detected on the low-voltage side of the transformer, i.e. from within the photovoltaic system, and the photovoltaic system is to be disconnected from the grid after identification of specific fault states. A fault state which is relevant in this respect is in particular a single-phase phase loss, i.e. an interruption between the photovoltaic system and the energy supply grid or within the energy supply grid on one of generally three phases.

In principle, a single-phase phase loss can be detected by means of measuring devices within the energy supply grid, i.e. on the output side (high-voltage side) of a YNd transformer. The current flow can be monitored, for example, in all three phases, and a failure of a phase can be detected directly. Such a solution is very complicated and cost-intensive, however, owing to the complex measurement technology on the high-voltage side.

The document U.S. Pat. No. 4,600,961 describes an apparatus and a method for detecting high-resistance ground faults in a three-phase energy supply grid. The apparatus comprises current sensors for measuring currents flowing in the three phases, wherein positive-sequence and negative-sequence currents are determined from the measured current values by means of suitable filters, and a ratio of the negative-sequence current to the positive-sequence current is formed. A high-resistance ground fault is indicated when this ratio exceeds a threshold value assigned to it. This apparatus is also correspondingly complex owing to the necessarily complex measurement technology for measuring at the high voltages in the energy supply grid.

For feeding electrical energy into the energy supply grid, power switches in an output stage, usually an output bridge, of the inverter are actuated in a pulse-width modulation method (PWM method). For this purpose, output currents and output voltages as well as the fundamental frequency thereof are detected. Depending on a difference between the setpoint values and the actual values of the output currents, control values for the output currents are determined. Alternatively, in the case of so-called voltage-regulated inverters, a difference between the setpoint values and the actual values of the output voltages is formed and control values for the output voltages are determined. Pulse-width-modulated control signals for the power switches of the inverter are generated from the control values for the output currents or the output voltages, and the power switches are clocked correspondingly on the basis of the control signals.

Depending on the type of transformer used between the inverter and the energy supply grid, certain fault states of the energy supply grid are mapped onto the inverter-side AC voltage grid of the photovoltaic system and can be detected there and possibly taken into consideration. In the case of the mentioned YNd transformers, however, especially single-phase phase losses of the energy supply grid on the AC voltage side are not mirrored directly on the other side of the transformer, i.e. within the photovoltaic system. In the case of other transformer types, for example the so-called YNy transformers, a phase loss is mapped directly onto the side of the photovoltaic system and can be identified by known operating methods of the inverter and taken into consideration. With this transformer type, however, the precondition of effective grounding as mentioned in the outset is not provided.

SUMMARY

In one embodiment of the present disclosure a method for detecting a phase failure for an inverter is disclosed. In one embodiment an inverter of the type mentioned at the outset which is connected to the energy supply grid in a manner galvanically isolated via a transformer is contemplated, in which a single-phase phase loss in the energy supply grid is identified quickly and reliably. An inverter suitable for implementing the method is also disclosed.

In a method according to one embodiment of the disclosure, values for the output currents and output voltages of the inverter are sensed, and power switches of the inverter are switched using control signals, wherein the control signals are generated depending on the values of the output currents and output voltages at a fundamental frequency of the energy supply grid. The method comprises transforming the output current values into a symmetrical positive-sequence current value and a symmetrical negative-sequence current value of a coordinate system rotating with the fundamental frequency of the energy supply grid. The method further comprises determining a ratio of the negative-sequence current value to the positive-sequence current value and detecting a phase failure in the energy supply grid if the ratio of the negative-sequence current value to the positive-sequence current value is greater than a preset threshold value for longer than a preset time period.

Thus, it is possible to identify a phase failure in the energy supply grid quickly and simply on the low-voltage side without any intervention in the energy supply grid. Since the measurement is based exclusively on measured values that are determined on the low-voltage side of the YNd transformer, the method can be implemented without any complex measurement technology. The disclosure makes use of the fact that a criterion which is easy to check for the detection of the phase failure can be specified in the rotating coordinate system, whereas the phase failure cannot be identified directly from the measured current values. The preset time period for which the criterion needs to be met makes it possible to distinguish reliably between the phase failure and, for example, a grid instability, which the inverter should ride through without any shutdown.

In an advantageous embodiment of the method, the inverter is at least temporarily disconnected or a fed electric power of the inverter is reduced if a phase failure has been detected. Thus, impermissible feeding by the photovoltaic system in the identified fault state of the energy supply grid is suppressed.

In a further advantageous embodiment of the method, the rotating coordinate system is a dq system. Likewise advantageously, the negative-sequence current value and the positive-sequence current value are determined as part of a control and/or regulation method for determining the control signals for the power switches of the inverter. Regulation methods for determining the control signals for the power switches of the inverter often use a representation of the measured current and also voltage values in a rotating coordinate system, for example the dq system. Therefore, the values required for the method according to the disclosure for detecting a phase failure are already present within the inverter. The method according to the disclosure can then be implemented with a low level of additional complexity.

In a further advantageous embodiment of the method, the threshold value for the ratio of the negative-sequence current value to the positive-sequence current value is between 0.1 and 0.6 and in particular between 0.2 and 0.4. Further advantageously, in one embodiment the preset time period is between 1 and 2 seconds. These values represent practice-oriented and reliable criteria for distinguishing between a fault which needs to be riden through, in which the photovoltaic system should not be disconnected from the energy supply grid, and a phase failure.

In a further embodiment of the method, the length of the preset time period is selected depending on the magnitude of the ratio of the negative-sequence current value to the positive-sequence current value, wherein, in the case of a relatively large ratio, a relatively short time period is selected. A higher value for the ratio makes it possible to conclude with greater reliability that there is a phase failure, for which reason the time period before detection and signalling of the phase failure can be shortened. In this case, the length of the preset time period can be matched dynamically to the magnitude of the ratio of the negative-sequence current value to the positive-sequence current value or alternatively the threshold value for the ratio of the negative-sequence current value to the positive-sequence current value can be matched dynamically to the magnitude of the positive-sequence current value.

In a further embodiment of the method, a phase failure is only signalled when, in the case of a ratio of the negative-sequence current value to the positive-sequence current value which is above the threshold value, the output voltages are substantially unchanged with respect to a normal operating mode, i.e., for example, deviate by less than 10% from their rated value. In the event of a ground fault or a short circuit, the mains voltage deviates from its nominal value markedly differently than in the case of a phase failure. With this additional criterion, delimitation of the phase failure from a short circuit or a ground fault can take place since, in the case of a single-phase voltage failure, the voltages remain largely constant for the described system structure. Fault identification and delimitation with respect to other grid faults therefore takes place by logic combination of the ratio of the negative-sequence current value to the positive-sequence current value and the amount of time for which the threshold value is overshot, taking into consideration the grid voltage.

Alternatively, an upper limit value for the ratio of the negative-sequence current value to the positive-sequence current value can also be introduced, and this limit value is above the previously introduced threshold value and is, in one embodiment, advantageously between approximately 0.8 and 1.2. A phase failure is detected when the ratio of the negative-sequence current value to the positive-sequence current value is greater than the threshold value but less than the upper limit value. Values for the ratio which are above the upper limit value tend to indicate a ground fault or short circuit, and not a phase failure.

An inverter according to the disclosure, adapted for feeding electrical energy into an energy supply grid via a YNd transformer, is characterized by the fact that it has a control device, which is configured to implement a previously mentioned method. The advantages mentioned in connection with the method are provided.

BRIEF DESCRIPTION OF THE DRAWINGS

The disclosure will be explained in more detail below with reference to an example embodiment with the aid of figures, in which.

DETAILED DESCRIPTION

Figure 1:
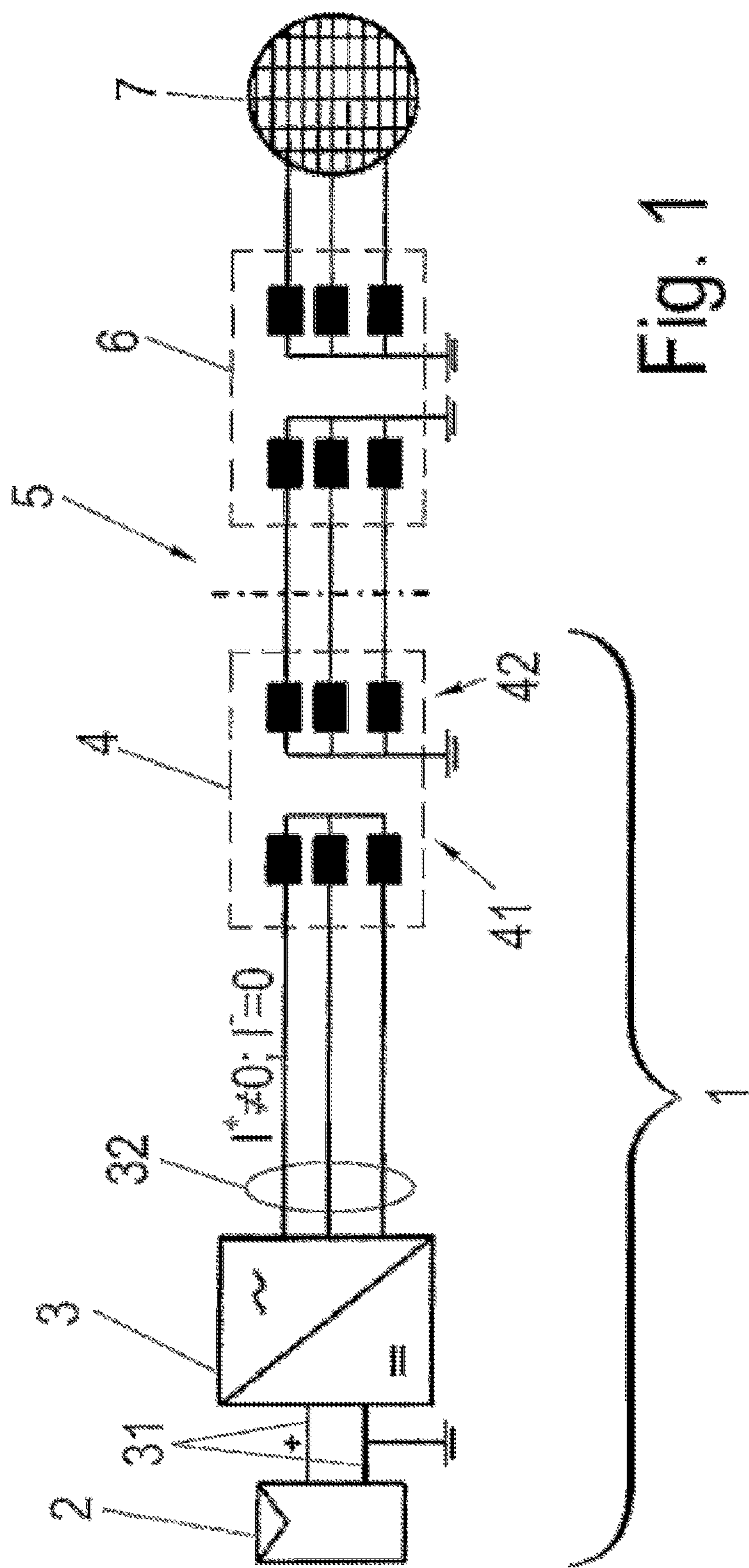
FIG. 1 shows a schematic illustration of a PV system connected to an energy supply grid.

FIG. 1 shows a block circuit diagram of a PV system 1 as an example of a decentralized energy supply system. The PV system 1 comprises a PV generator 2, which is connected to an inverter 3 via a DC input 31. The inverter 3 is connected to a low-voltage side 41 of a transformer 4 via AC outputs 32. The transformer 4 in the example illustrated is a medium-voltage transformer, which provides voltages in the range of 6 to 36 kV (kilovolts) on its high-voltage side 42 and is correspondingly connected to a medium-voltage grid at energy supply grid 5. Specifically, the transformer 4 is embodied as a so-called YNd transformer ("YN" high-voltage side, "d" low-voltage side), which is characterized by a star circuit comprising the three phases of the medium-voltage energy supply grid 5 and a grounded neutral point on the medium-voltage side and a delta circuit on the low voltage side.

The structure of the PV system 1 is illustrated by way of example and in simplified form in FIG. 1. The PV generator 2, merely symbolized by the circuit symbol of a PV cell in FIG. 1, generally comprises a multiplicity of PV modules in the case of a PV system 1 feeding directly into the medium-voltage energy supply grid 5, of which PV modules in each case a plurality are connected in series to form so-called PV strings, which are in turn each connected in parallel with the inverter 3. In the case of systems of this type, the inverter 3 is generally in the form of a central inverter. The inverter 3 in the example illustrated is embodied as a three-phase inverter, as is conventional in conjunction with medium-voltage energy supply grids 5. FIG. 1 only illustrates those parts of the PV system 1 which are essential within the scope of the application. Further elements arranged on the DC or AC side of the inverter 3, such as, for example, disconnecting or switching elements, filters or monitoring devices, are not illustrated for reasons of clarity.

Generally, further downstream from the medium-voltage energy supply grid 5, remote from the PV system 1, a (high-voltage) transformer 6 is provided, via which the medium-voltage level is connected to a high-voltage energy supply grid 7.

By virtue of the galvanic isolation of the low-voltage side 41 of the transformer 4 from the high-voltage side 42, separate grounding of the PV system 1, as is often required by operators of the energy supply grid 7, can take place, in this case by virtue of a negative pole of the PV generator 2 being connected to a ground potential, for example. Owing to the complete galvanic isolation of the PV system 1 from the medium-voltage energy supply grid 5, it is difficult during operation of the inverter to identity a failure of one of the phases in the medium-voltage energy supply grid 5, for example, taking place in the dash-dotted line illustrated in FIG. 1, or of the high-voltage energy supply grid 7.

Figure 2:
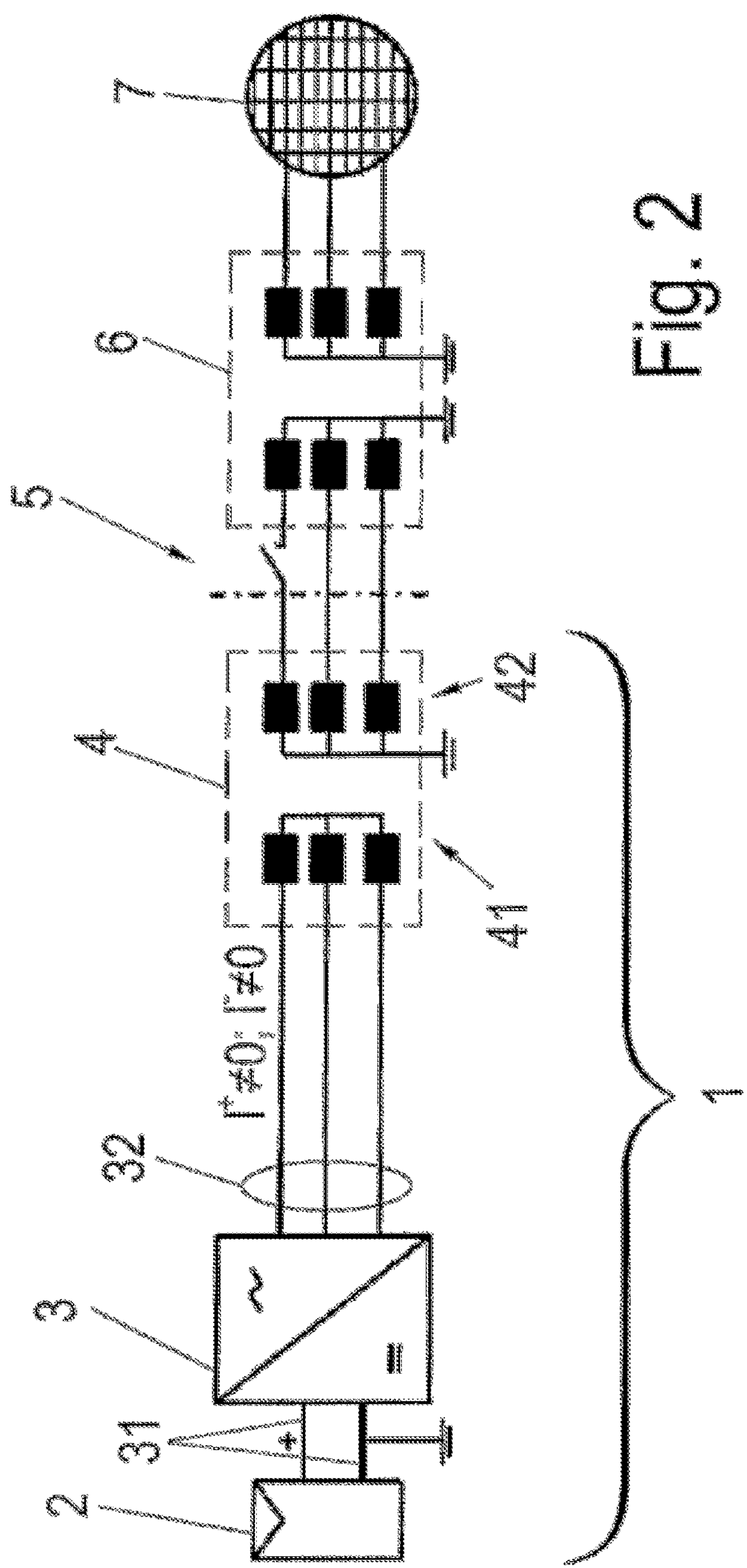
FIG. 2 shows a schematic illustration of a phase failure in the energy supply grid.

Such a phase failure is symbolized in FIG. 2 by an open switch in one of the phase conductors in the medium-voltage energy supply grid 5. The method according to the disclosure for detecting and signalling the phase failure is based on the finding that, although such a phase failure does not manifest itself directly in measured voltages and/or currents at the output of the inverter 3, such a phase failure may be derived from the currents if the currents are represented in a rotating coordinate system. Specifically, a negative-sequence current $I^-$ and a positive-sequence current $I^+$ are considered for this purpose.

For the normal operation situation in FIG. 1 and the phase failure in FIG. 2, these currents are specified by way of example in the figures: during normal operation, the positive-sequence current $I^+$ is unequal to zero and the negative-sequence current $I^-$ is zero or at least low compared to the positive-sequence current $I^+$. In the event of a phase failure, the inverter continues to feed energy into the medium-voltage energy supply grid 5, wherein the three-phase current of the inverter 3 is distributed, owing to the delta circuit on the low-voltage side 41 of the transformer 4, among the windings of the medium-voltage side of the transformer 4 which are assigned to the two intact phases, with the result that an ampere-turns balance remains in the transformer 4 despite the failed phase. Likewise, the grid voltages will remain constant owing to the low zero sequence impedance of the YNd transformer 4 and the resultant low level of neutral point shift. However, the current no longer consists of purely a positive-sequence current $I^+$, but has a certain content of a negative-sequence current $I^-$ owing to the fault profile. The negative-sequence current $I^-$ will therefore likewise be unequal to zero.

In connection with FIGS. 3 to 5, a regulation method for an inverter, for example the inverter 3 in FIGS. 1 and 2, will be described below which is supplemented by a method in which such a single-phase fault is identified and signalled safely, quickly and reliably.

Figure 3:
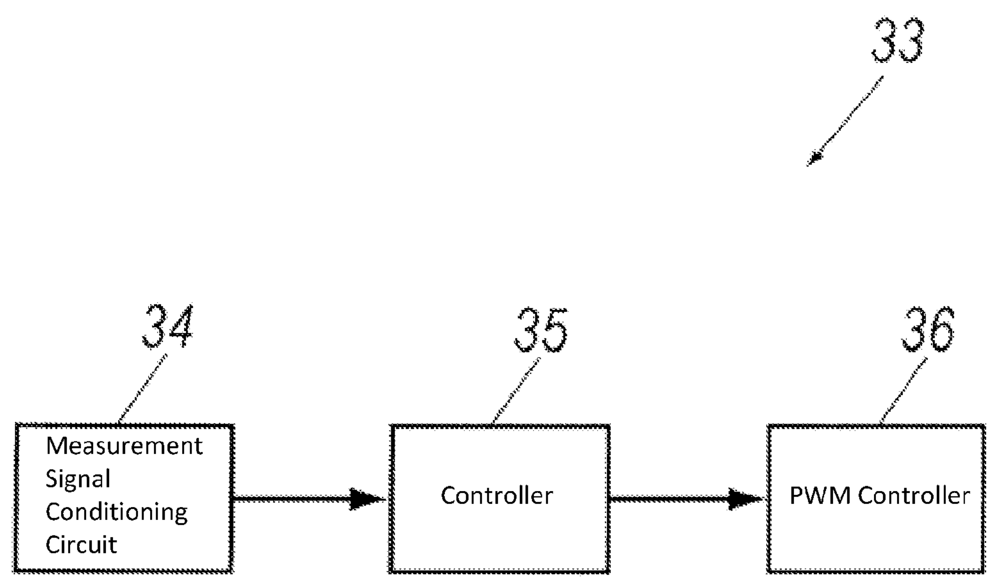
FIG. 3 shows a schematic illustration of a control loop for controlling an inverter.

FIG. 3 shows a control loop 33 of the inverter 3 in a block circuit diagram. The control loop 33 is used for the actuation of power semiconductor switches, which switch the currents flowing at the AC outputs 32 in an output bridge circuit of the inverter 3.

The control loop 33 has a measurement signal conditioning unit 34, to which potentials present at measurement points or present at the AC output 32 and measured by current sensors and currents flowing there are supplied. The conditioned measurement signals are supplied to a controller 35, which operates at the fundamental frequency of the energy supply grids 5, 7. Control values determined by this controller 35 are supplied as control values to a PWM controller 36. This PWM controller 36 generates actuation signals for the power semiconductor switches in the output bridges of the inverter 3.

Figure 4:
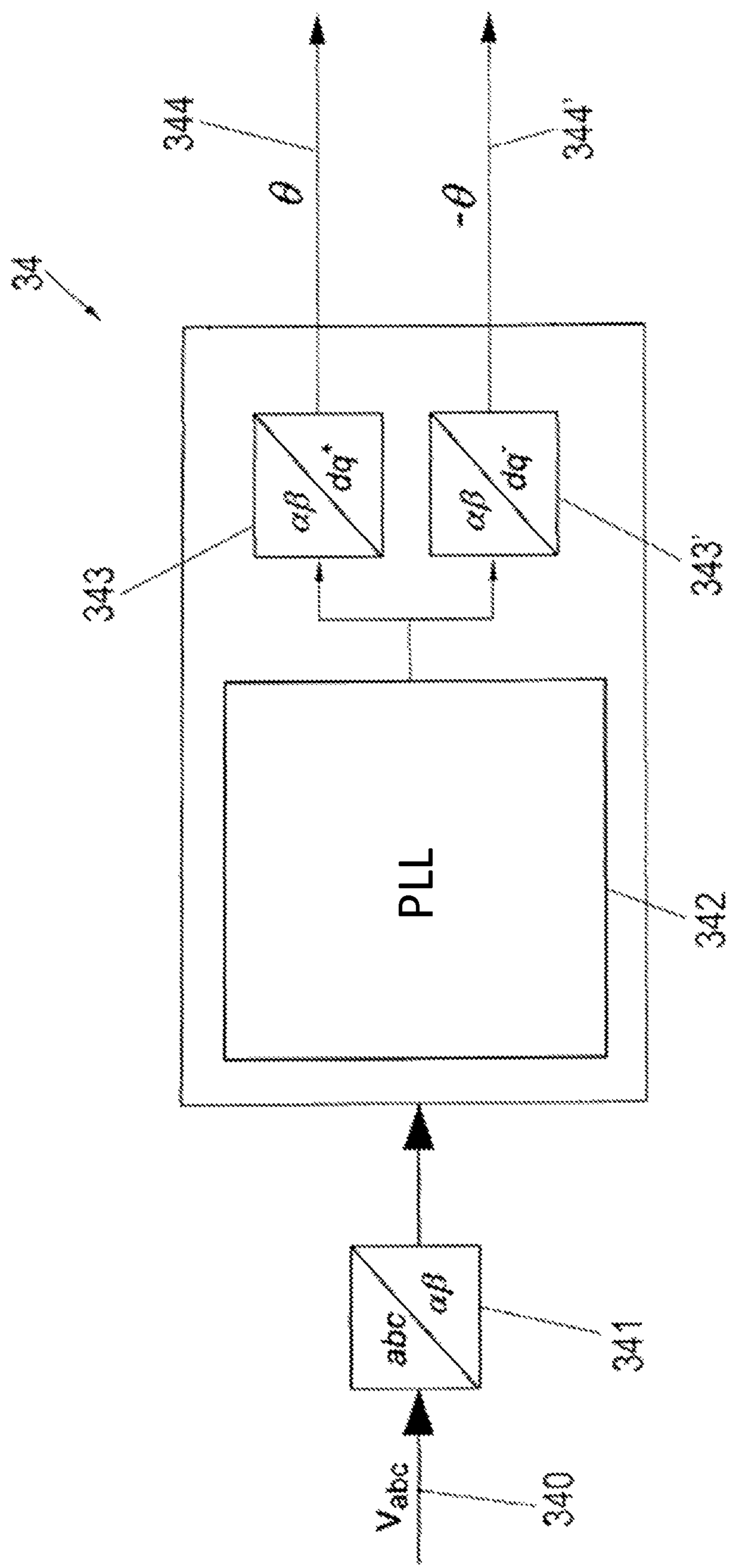
FIGS. 4 and 5 each show a block circuit diagram of part of the control loop illustrated in FIG. 3.
Figure 5:
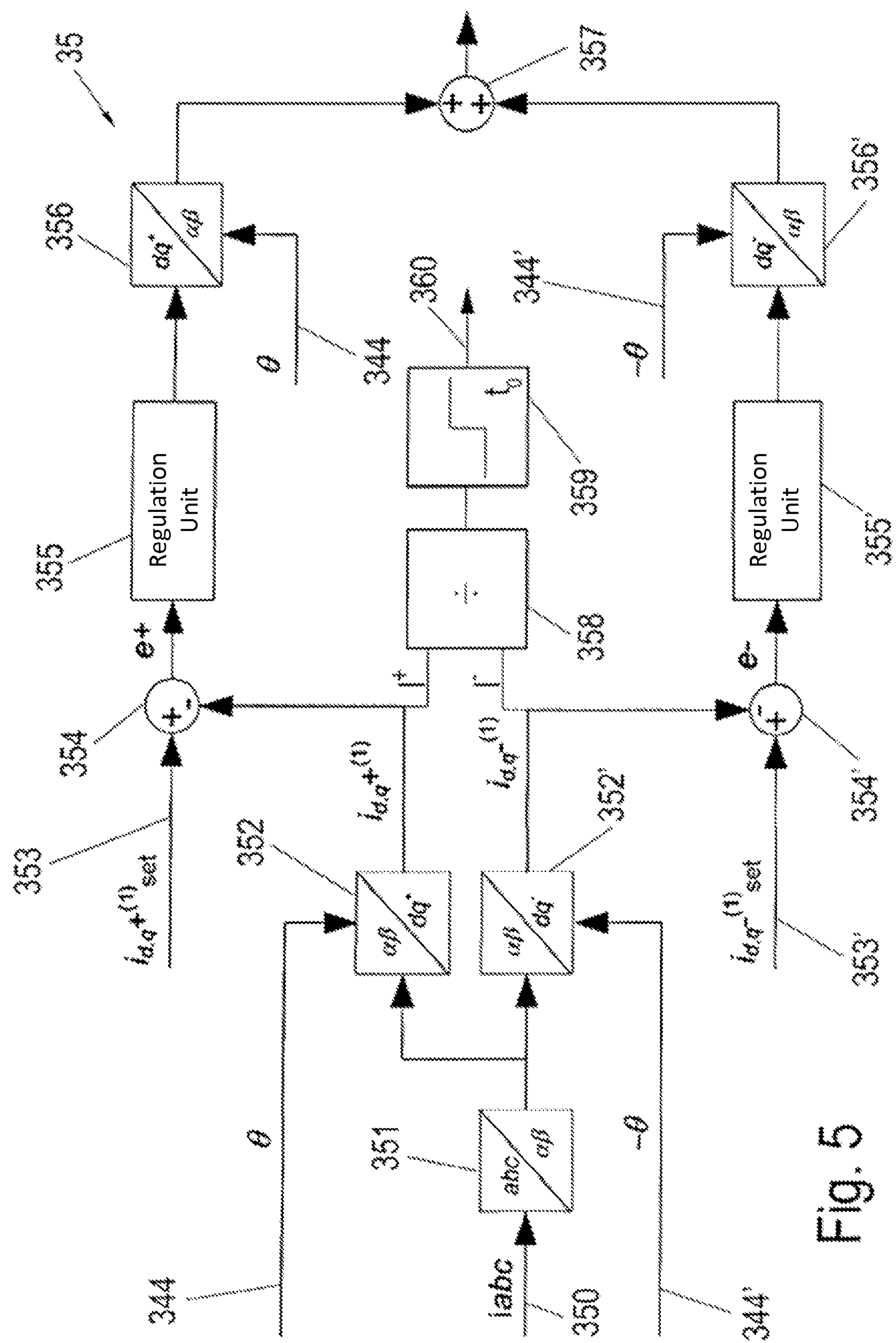

The measurement signal conditioning unit 34 and the controller 35 of the control loop 33 are illustrated in more detailed block circuit diagrams in FIGS. 4 and 5.

In the case of the control loop 33 used in the example embodiment shown, transformation of measured time-dependent current and voltage measurement signals into a rotating coordinate system, the so-called dq coordinate system, is performed. When the measurement signals are represented in a rotating coordinate system, steady-state controllers, for example PI (proportional/integral) controllers, can be used. In the case of the control loop 33, both a positive-sequence system and a negative-sequence system whose phase sequence is inverted with respect to the positive-sequence system are taken into consideration.

The representation of measured variables in a dq coordinate system is known in principle in connection with the regulation of inverters. Therefore, no further details will be given below in respect of specifics of the transformations involved and their implementation in analogue and/or digital circuit technology.

FIG. 4 illustrates the measurement signal conditioning unit 34 of the control loop 33. Input variables for the measurement signal conditioning unit 34 are voltage measurement signals 340, which represent the voltages $V_a$, $V_b$, $V_c$, combined as vector $V_{abc}$, at the individual phases a, b, c at the AC output 32 of the inverter 3.

The voltage measurement signal 340 is converted in an $\alpha\beta$ transformation unit 341 into an orthogonal two-phase steady-state coordinate system, the so-called $\alpha\beta$ coordinate system. The $\alpha\beta$ components obtained are in this case supplied to a PLL (phase-locked loop) circuit 342.

The PLL circuit 342 is tuned to a fundamental frequency of the voltage measurement signal 340. The PLL circuit 342 can be constructed, for example, with the aid of a quadrature signal generator in a known manner. As an alternative to the PLL circuit 342 used here, a bandpass filter can also be used to determine the fundamental components.

The output of the PLL circuit 342 is then converted into dq components in dq transformation units 343, 343'. In this case, the dq transformation unit 343 generates dq components in the positive-sequence system, and the dq transformation unit 343' generates dq components in the negative-sequence system. The positive-sequence system describes a purely symmetrical system, in a likewise known manner, whereas asymmetries can be taken into consideration by the negative-sequence system, which has an inverse phase sequence in comparison with the positive-sequence system. Within the scope of the application, reference symbols without an apostrophe (') identify positive-sequence system components and reference symbols with an apostrophe identify negative-sequence system components.

As a result, phase angles 344 and 344' of the fundamental for the positive-sequence system and negative-sequence system which are generated (synthesized) by the PLL circuit 342 are output by the measurement signal conditioning unit 34.

FIG. 5 shows the controller 35 of the control loop 33 in more detail in a blocked circuit diagram. Input variables for the controller 35 are a current measurement signal 350, which represents, similarly to the voltage measurement signal 340, a current $I_A$, $I_B$, $I_C$, combined as vector $I_{ABC}$, for three phases A, B, C at the AC output 32 of the inverter 3. The current measurement signal 350 is reproduced again in a steady-state two-phase coordinate system in an α/β transformation unit 351. The determined components α and β which are orthogonal to one another are supplied to dq transformation units 352 and 352', which receive the phase angles 344 and 344', respectively, from the measurement signal conditioning unit 34 as further input variables. The outputs of the dq transformation units 352 and 352' are supplied to subtractors 354 and 354', respectively, as actual current signals in the dq system. Setpoint current values 353 and 353' are applied to the subtractors 354 and 354', respectively, as setpoint current values. The setpoint current values 353 are each vectorial variables, which include a setpoint value for the d component and a setpoint value for the q component, wherein the d component specifies an active current component and the q component specifies a reactive current component. The differential signal generated by the subtractors 354, 354' are supplied to regulation units 355, 355', which are in this case implemented as PI controllers. The regulation outputs are transformed back into α/β components in the dq back-transformation units 356 and 356' in the positive-sequence system/negative-sequence system, respectively, which α/β components are added in an adder 357 at the output of the controller 35. The output of the adder 357 can be supplied directly to the PWM controller 38 from FIG. 3.

Since the positive-sequence current value $I^+$ and the negative-sequence current value $I^-$ are already determined and used at the outputs of the dq transformation units 352 and 352' within the context of the control method for the inverter 3, the values required for the method according to the disclosure for detecting and signalling a phase failure are therefore already present. The values are supplied to a divider 358, which forms the ratio between the negative-sequence current value $I^-$ and the positive-sequence current value $I^+$. This ratio is output at the output of the divider 358 and supplied to a threshold value switch 359, in which a timing element is integrated. If the ratio $(I^-)/(I^+)$ exceeds a preset threshold value for at least one preset time period $t_0$, a signal is output at a signal output 360 of the threshold value switch 359 signalling the presence to a single-phase phase failure.

Advantageously, the preset threshold value for the ratio $(I^-)/(I^+)$ is between 0.1 and 0.6 and particularly in one embodiment between 0.2 and 0.4. Low negative-sequence current values $I^-$ differing from zero do indeed occur at least occasionally during normal, non-faulty operation of the inverter 3 and the energy supply grid 5 or 7. Only when the ratio of the negative-sequence current value $I^-$ to the positive-sequence current value $I^+$ is greater than the threshold value for the specified time period $t_0$ does this indicate a phase failure. The preset time period $t_0$ is in the range of from one to two seconds in one embodiment. Fault states which are shorter than the time period $t_0$ are generally fault states which the photovoltaic system is intended to ride through, in particular those fault states of the energy supply grid 5, 7 in which the inverter 3 is intended to remain connected to the energy supply grid 5, 7 in order to support the energy supply grid 5, 7 in this fault event.

An inverter which uses such a regulation method can therefore be fitted out in a simple manner or retrofitting can be performed, possibly by updating the programs controlling the inverter (so-called firmware update) so that the inverter can implement the method according to the disclosure for identifying a failure of a phase.

In a further embodiment of the method, provision is made for the length of the preset time period $t_0$ to be selected depending on the magnitude of the ratio of the negative-sequence current value $I^-$ to the positive-sequence current value $I^+$. The greater the magnitude of the ratio determined between the current values $I^-$, $I^+$, the shorter the time period $t_0$ is selected to be. In this embodiment, the preset time period $t_0$ is therefore varied dynamically with respect to the magnitude of the determined ratio of the negative-sequence current value $I^-$ to the positive-sequence current value $I^+$. In this configuration, account is taken of the fact that a very asymmetric current distribution, which manifests itself as a high negative-sequence current value $I^-$ and therefore correspondingly also a high ratio of this negative-sequence current value $I^-$ to the positive-sequence current value $I^+$, increases the probability of the presence of a phase failure, with the result that this can be signalled even after a shorter wait time.

The signal at the signal output 360 can be used to curtail the inverter 3 such that there is no longer any current being fed into the energy supply system 5, 7. As an alternative and/or in addition, an AC disconnecting element provided within the PV system can be activated, which disconnects the transformer 4 from the output of the inverter 3.

In a further embodiment, the magnitude of the voltages $V_{abc}$ is additionally taken into consideration as a further criterion. A phase failure is only considered as having been detected when the voltages $V_{abc}$ do not change, or only change to an insignificant extent, for example by at most ±10%, in the event of the threshold value being overshot. With this criterion, it is possible to distinguish between phase failure and a short circuit or ground fault since, in the event of a single-phase voltage failure, the voltages remain largely constant for the described system structure.

Fault identification and distinguishing from other grid failures therefore takes place by logic combination of the ratio of the negative-sequence current value $I^-$ to the positive-sequence current value $I^+$ and the time period for which the threshold value is exceeded taking into consideration the grid voltage $V_{abc}$ and/or an upper limit value for the ratio of the negative-sequence current value $I^-$ to the positive-sequence current value $I^+$. The mentioned upper threshold value is above the previously introduced threshold value and can advantageously be between approximately 0.8 and 1.2. In the event of a ground fault or short circuit, the grid voltage $V_{abc}$ deviates markedly from its nominal value differently than in the case of a phase failure. As an alternative and/or in addition, the magnitude of the ratio of the negative-sequence current value $I^-$ to the positive-sequence current value $I^+$ can be used as distinguishing criterion since very high values for the ratio which are above the upper limit value indicate a ground fault or short circuit and not a phase failure.

A further advantage of the method according to the disclosure is that a phase loss can be detected without any requirements in respect of the dynamic grid support in the event of a short circuit on the grid being at risk in the process.

The invention claimed is:

1. A method for detecting a phase failure in an energy supply grid during operation of an inverter, which is connected to the energy supply grid for feeding electrical energy via a YNd transformer, wherein values for an output current and an output voltage of the inverter are sensed, and power switches of the inverter are switched using control signals, wherein the control signals are generated depending on the values of the output current and output voltage at a fundamental frequency of the energy supply grid, comprising:

transforming the output current values into a symmetrical positive-sequence current value and into a symmetrical negative-sequence current value of a coordinate system rotating at the fundamental frequency of the energy supply grid using a measurement signal conditioning circuit;

determining a ratio of the negative-sequence current value to the positive-sequence current value using a controller; and detecting a phase failure in the energy supply grid if the determined ratio of the negative-sequence current value to the positive-sequence current value is greater than a preset threshold value for longer than a preset time period using the controller.

2. The method according to claim 1, wherein the inverter is at least temporarily disconnected or a fed electric power of the inverter is reduced if a phase failure is detected.

3. The method according to claim 1, wherein the rotating coordinate system is a dq system.

4. The method according to claim 1, wherein the threshold value for the ratio of the negative-sequence current value to the positive-sequence current value is between 0.1 and 0.6.

5. The method according to claim 1, wherein the preset time period is between 1 and 2 seconds.

6. The method according to claim 1, wherein a length of the preset time period is selected depending on the magnitude of the determined ratio of the negative-sequence current value to the positive-sequence current value using the controller, wherein the preset time period and the determined ratio are inversely related.

7. The method according to claim 6, wherein the length of the preset time period is adjusted based on the magnitude of the ratio of the negative-sequence current value to the positive-sequence current value using the controller.

8. The method according to claim 6, wherein the threshold value for the ratio of the negative-sequence current value to the positive-sequence current value is adjusted based on the magnitude of the positive-sequence current value using the controller.

9. The method according to claim 1, wherein a phase failure is only signaled when, in the case of the determined ratio of the negative-sequence current value to the positive-sequence current value is above the threshold value, the output voltages are substantially unchanged with respect to a normal operating mode.

10. The method according to claim 9, wherein the output voltages are substantially unchanged when they deviate from their rated value by less than 10%.

11. The method according to claim 1, wherein the negative-sequence current value and the positive-sequence current value are determined as part of a control or regulation method for determining the control signals for the power switches of the inverter using the controller.

12. An inverter adapted for feeding electrical energy into an energy supply grid via a YNd transformer, the inverter including a control system, the control system comprising:

a control unit configured to receive output measurement values from an output of the inverter, and selectively generate a phase failure detection signal based thereon; and a safety circuit configured to isolate the inverter from a low voltage side of a transformer at an output thereof when the phase failure detection signal indicates occurrence of a phase failure associated with a grid at a high voltage side of the transformer, wherein the control unit comprises:

a transformation circuit that receives three-phase output current values and generates a symmetrical positive-sequence current value and a symmetrical negative-sequence current value based thereon;

a divider configured to generate a ratio based on the symmetrical positive-sequence current value and the symmetrical negative-sequence current value; and a threshold value switch configured to selectively output the phase failure detection signal if the ratio output from the divider exceeds a preset threshold for a time period that exceeds a present time threshold.

* * * * *